June 8, 1965 W. PFERD 3,188,598

PRINTED CIRCUIT BOARD CONNECTOR

Filed June 20, 1962 2 Sheets-Sheet 1

INVENTOR
W. PFERD
BY John C. Morris
ATTORNEY

INVENTOR
W. PFERD
BY John C. Morris
ATTORNEY 3,188,598

PRINTED CIRCUIT BOARD CONNECTOR

William Pferd, Watchung, N.J., assignor to Bell Telephone Laboratories, Incorporated, New York, N.Y., a corporation of New York Filed June 20, 1962, Ser. No. 203,840
7 Claims. (Cl. 339—17)

This invention relates to devices for making electrical connections with printed circuit boards and, more specifically, to devices whereby electrical connections to printed circuit boards can be made with controllable frictional wear on the printed circuit.

Because of the delicate nature of printed circuits and the present methods of bonding or etching printed circuitry on boards or flexible materials, excessive frictional wear upon inserting a printed circuit board in a connector can permanently damage the thin metal etchings or bondings. Pre-tensioned terminals can in time wear through the thin metal, resulting in erratic performance or failure of a system and have been known to peel the circuitry off its base material, permanently damaging the circuit board. Since reliability is a necessity for successfully marketing printed circuits and connectors, reduction of the pretensioning of the terminals does not supply an answer to this problem unless the tension can subsequently be reinstated to supply adequate contact force for reliability. Some connectors now available supply this function through manual operations after the circuit board has been inserted in the connector.

An object of this invention is to reduce the frictional wear on printed circuits entailed by the insertion of printed wiring boards into connectors.

A feature of the invention is the provision of a printed circuit board connector having shaped terminals or contacts that are position controlled by a cam.

Another feature of my invention lies in supplying a printed circuit board connector wherein the amount of frictional wear between a terminal of the connector and a printed circuit can be adjusted or controlled by changing the position of a cam that cooperates with the terminal.

A further feature of this invention is a printed circuit board wherein frictional wear is automatically controlled by the interaction of a shaft, gear, cam arrangement and an inserted printed circuit board.

In accordance with a preferred embodiment of the invention, the connector includes an insulating block or support having an elongated rectangular interior cavity within which is mounted a plurality of J-shaped contacts or terminals along the two elongated sides, and two rotatable shafts. Turning means, in this instance a gear or sprocket, are secured to each end of the shafts and interspersed between the gears is a plurality of cams, one of which is located within the hooked portion of each J-shaped contact. The gears are positioned to operatively engage a special printed circuit board as it is inserted into the insulating block cavity. The gears and the cams are securely fastened to the shafts so that rotation of the gears causes the shafts and cams to rotate together.

The connector, for purposes of description and claiming, is bi-positional; one position being the receiving position, the other an electrical connecting position. The J-shaped contacts or terminals in both of the above positions are resiliently urged toward the center line of the insulating block opening but the terminals on one side do not touch the terminals on the other side of the opening. The receiving position differs from the electrical connection position in that the turning means or gears are rotated up towards the opening of the insulating block to receive a printed circuit board, while in the electrical connecting position they are rotated down and assist in retaining the printed circuit board within the connector. Each cam located within the hooked portion of the contact has an expanded radius portion which imparts a toggle-like action to the gear-cam arrangement. When the connector is in the receiving position, the contiguity between the expanded radius portion of the cam and the contact exerts a torque on the shaft tending to keep the connector in a receiving position. Insertion of a printed circuit board rotates the gears and cams until the expanded radius portion of the cam goes over center and reverses the torque exerted on the shaft. This creates an electrically connecting position of the connector which tends to hold the printed circuit board in the connector insulating block. The reversal of the torque on the shaft is due to the toggle-like action of the expanded radius portion of the cam and the contact.

The connector is actuated; that is, electrical connection made, by changing the connector position from a receiving to an electrical connection position, by use of a special printed circuit board. Adjacent the inserted edge of the printed circuit board, holes are cut a predetermined distance from each other and from the edges of the board. These holes are shaped and placed to mate with the gear teeth of the connector for rotating the shafts. When a printed circuit board is first introduced into the connector insulating block, the inserted edge of the board engages a first tooth of the sprocket or gear and begins to rotate the gear, shaft, cam arrangement. Rotation of the shaft causes the expanded radius portion of the cam, which previous to initial rotation tended to hold the connector in a receiving position, to urge the contacts toward the cavity walls of the insulating block or away from the opening into the cavity. The printed circuit board can thus be inserted with a controlled amount of wiping action or, if desired, none at all. Continued insertion of the board forces a second tooth of the gear into engagement with the edge of the hole in the printed circuit board causing further rotation of the shaft and cams. The expanded radius portion of the cam is rotated over-center, releasing the contacts to an electrically connecting position and reversing the torque on the shafts. The reverse torque tends to hold the circuit board in the connector, resisting extraction.

It is to be noted that the degree of wiping action or frictional wear can be controlled by the extent of the expansion of the radius of the cam. A substantial increase in the radius of the expanded radius portion of the cam will urge the contacts a greater distance away from the insulating block opening, thereby preventing any frictional wear at all, while a small increase in radius will reduce the magnitude of the frictional wear, providing a beneficial wiping action between the printed circuit and the contacts if one is desired.

It is further to be noted that the point where frictional or wiping action on the circuit board is initiated can be further adjusted or controlled by changing the rotational placement of the cams on the shaft. In this manner, the wiping action can be advanced or delayed to sustain such action over a significant part of the insertion process or it can be eliminated by cam releasing the contacts just as the insertion process of the printed circuit board terminates.

The invention will be more clearly understood from the following detailed description, when read in conjunction with the drawing, in which.

Figure 1:
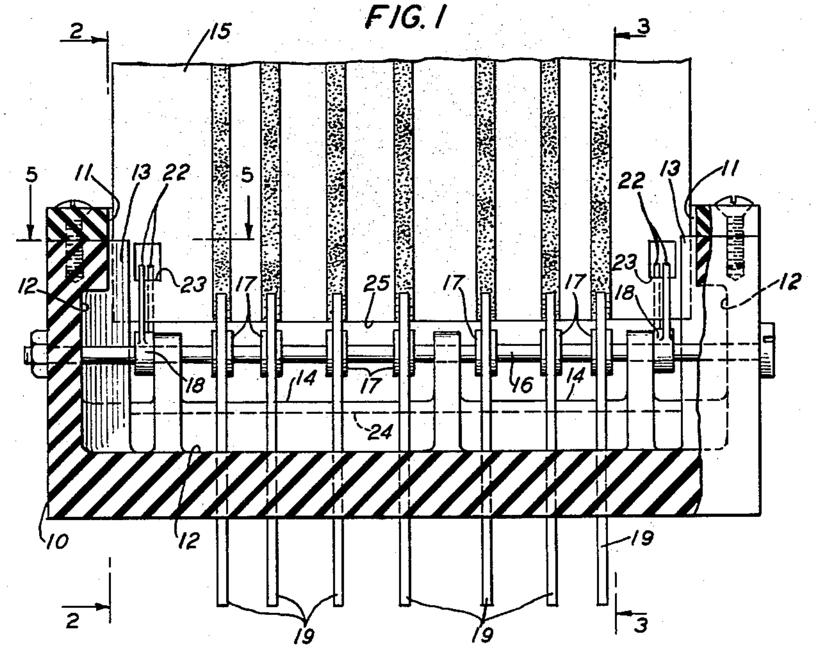
FIG. 1 is a sectioned view of the connector showing the respective location of the various elements when the connector is in a receiving position.
Figure 2:
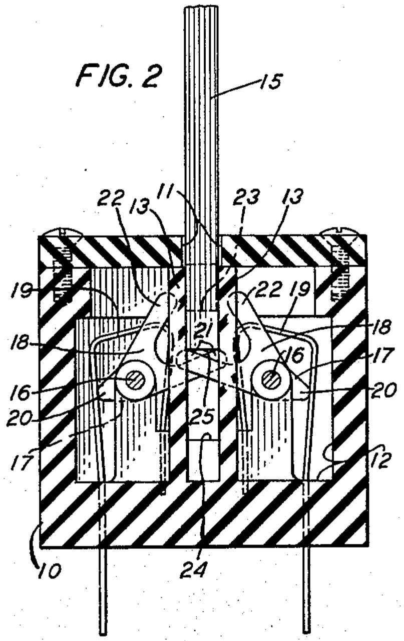
FIG. 2 is a section view taken generally along the line 2—2 of FIG. 1 showing the respective location of the various elements when the connector is in a receiving position.
Figure 3:
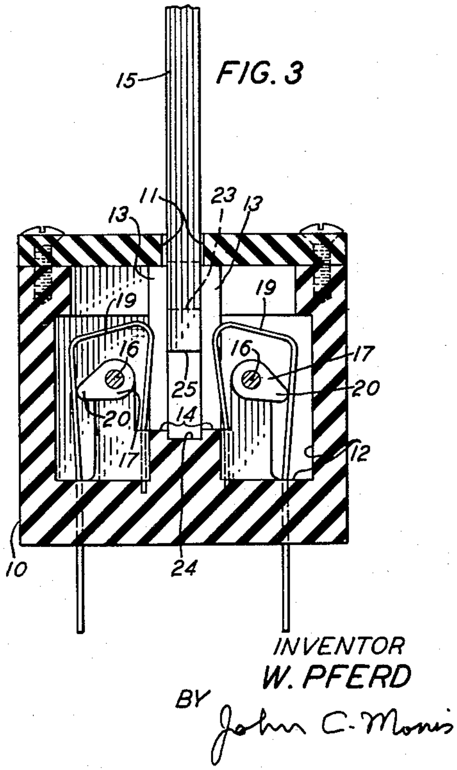
FIG. 3 is a section view taken generally along the line 3—3 of FIG. 1 showing the cooperation between the cams and the terminals.

According to the invention as depicted by the various figures, the connector includes an insulating block 10, having an opening 11 into an elongated rectangular interior cavity 12 for receiving a printed circuit board 15. Guiding means, comprising in this instance two elongated ribs 13 on each end wall of the interior cavity 12 and a trough formed from two floor ribs 14 and a floor surface 24, guide and direct the printed circuit board 15 as it is inserted into the insulating block 10. On either side of the elongated opening 11, J-shaped contacts or terminals 19 are located, resiliently urged toward the center line of the rectangular opening for producing elecrical continuity with the inserted printed circuit board 15. An assembly comprising shafts 16, cams 17 and gears 18 is mounted in the cavity 12 of the insulating block 10 so that one cam 17 is located within the hooked portion of each terminal 19 and there is a gear at either end of the shaft. The toothed element identified by the number 18 is used only for the purpose of disclosure. The invention contemplates the use of turning means to rotate the shaft 16 and the associated cam 17. Such means may include circular gears, sprockets, friction wheels, or other devices that yield the same desired results. The cam has at least one expanded radius portion 20 that is contiguous to one arm of the J-shaped contact 19. The turning means or gears 18 and the cams 17 are fixed to the shaft 16 so that rotation of the gears 18 cause rotation of the shaft 16 and the cams 17.

The gears 18, in this instance, have two teeth 21 and 22, the former cooperates with the leading edge 25 of the circuit board 15 and the latter, or second tooth 22, cooperates with the edge 23 of the holes in the circuit board 15 which are located a predetermined distance from the edges of the printed circuit board 15 and from each other.

Figure 4:
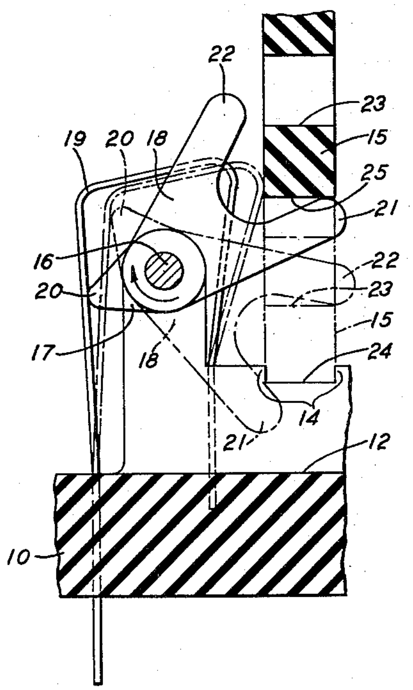
FIG. 4 is an end view showing the interaction between a shaft, cam, gear arrangement and a printed circuit board.
Figure 5:
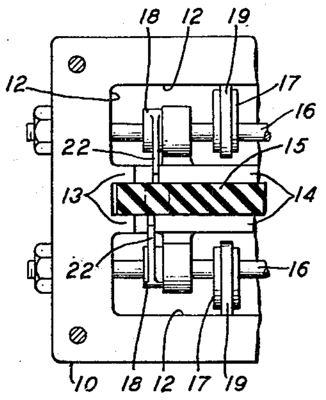
FIG. 5 is a view taken generally along line 5—5 of FIG. 1 showing the interaction between the gears and circuit board and the guiding means of the connector body.

The operation of this device is easily explained with reference to FIGS. 4 and 5. The receiving position of the device is illustrated by the solid lines in FIG. 4. The electrical termials 19 are resiliently urged toward the center line of the interior cavity 12 or in the direction of the printed circuit board 15. The contiguity between the extended radius portion 20 of the cam 17 and one arm of the terminal 19 creates a counterclockwise torque on the shaft 16 tending to hold the connector in the receiving position. The printed circuit board 15 upon insertion is guided into the interior cavity 12 by the guiding ribs 13 until the first tooth 21 of the gear 18 comes into engagement with the leading edge 25 of the circuit board 15. Continued insertion of the board 15 causes rotation of the gear 18 with the consequent rotation of the shaft 16 and the cams 17.

Upon rotation of the cams 17, the extended radius portion 20 forces the terminals 19 further from the incoming printed circuit board 15. The extended radius portion 20 also creates a toggle action to the cams in that after the extended radius portion 20 of the cam 17 is rotated over-center, the torque on the shaft 16 is reversed becoming a clockwise torque. The clockwise torque forces the second tooth 22 of gear 18 into engagement with the edge 23 of the hole in the printed circuit board 15, further forcing edge 25 of the printed circuit board 15 in engagement with the surface 24. The clockwise torque tends to restrain the printed circuit board from being extracted from the connecter. This latter position for purposes of description and claiming is designated the electrical connection position and is shown in dot-dash lines in FIG. 4. The circuit board 15 can be extracted by reversing the steps set forth above. Such procedure, due to the toggle action of the extended radius portions 20 of the cams 17 will leave the device in a receiving position for another printed circuit board.

In some applications, it is desirable to have a wiping action between the terminals 19 and the printed circuit on the board 15. Such action can be regulated by varying the extended radius portion 20 of the cam 17. If no wiping action is desired, the extended radius portion 20 can be increased so that the terminals 19 are completely removed from proximity of the printed circuit board 15 until the board 15 comes to rest against the surface 24. The magnitude of the wiping action can be increased by reducing the extended radius portion 20 of the cams 17.

The length of the wiping action can also be regulated by varying the rotational placement of the cams 17 on the shaft 16. If a long wiping action is desired, the cams 17 can be rotationally placed so that the terminals 19 will be released by the cams 17 a considerable time before the board 15 comes to rest against the surface 24. If a short wiping action is desired, the cams 17 can be rotationally placed on the shaft 16 so that the terminals 19 are not released by the cams 17 until the board 15 is nearly seated against the surface 24.

Variations of this device are obvious to those skilled in the art. Such departures from the specific embodiment set forth are too numerous to mention but are within the scope of the disclosure and the appended claims.

What is claimed is:

1. A connector for a printed circuit board comprising an insulating block having guide means for said board and a plurality of flexible contacts, a rotatable shaft bearing cams and turning means, said shaft mounted in said block, said contacts being made of a flat sheet of resilient electrically conducting material and being J-shaped in form, said contacts including at least one cam within the hooked portion of each contact, the latter resiliently urged toward said board in their nondeflected attitude, rotation of said shaft causing said cams to deflect said contacts first away and then toward said board.

2. A connector for a printed circuit board comprising an insulating block having a front face, said face including an opening into an interior cavity of said block, said cavity having guide means for a printed circuit board on at least one side wall, a plurality of flexible contacts and a rotatable shaft bearing cams and a sprocket mounted in said cavity, said cams rigidly fixed to said shaft and spaced along the latter adjacent to said contacts, said sprocket including at least two teeth, each of said teeth having a tooth face, said face of said first tooth cooperates with the inserted edge of said board and the face of said second tooth cooperates with the edge of an opening in said board to rotate said shaft, rotation of said shaft causes said cams to urge said contacts first away and then toward said board.

3. A connector according to claim 2 wherein the cooperation between the first tooth of the sprocket with the inserted edge of the circuit board comprises a butting of the edge of said board with the face of said first tooth and the cooperation of the second tooth of the sprocket with the opening in the board comprises a butting of said edge of said board opening with the face of said second tooth, said cooperation rotating the shaft and cams upon insertion of the printed circuit board, the rotation of said shaft and cams controlling the relative position of the contacts with respect to the printed circuit board by moving said contacts away from said board when the insertion of the latter into the connector is initiated and toward said board when the insertion of the board is terminated.

4. A printed circuit board connector comprising an insulating block having a front face with an opening in said face into an interior cavity, a plurality of J-shaped contacts and a rotatable shaft bearing at least one toothed element and cams mounted in said cavity; one cam located within the hooked part of each contact, said element positioned adjacent said opening, the insertion of a printed circuit board cooperating with the teeth of said element to rotate the latter, said rotation causing said cams to urge said contacts first away and then toward said board.

5. A connector for a printed circuit board comprising an insulating block having a plurality of flexible J-shaped contacts and at least one rotatable shaft mounted in said block, said shaft bearing cams and turning means, said cams spaced along said shaft so that at least one cam is located within the hooked portion of each contact, said means secured to said shaft in a position to jointly engage the edge of a circuit board being inserted in the connector and an opening in the board adjacent said edge, the turning means and the cams oriented so that the cooperation of the board and the means rotates the shaft and the cams, said rotation causing said cams to urge said contacts first away and then toward said board.

6. A connector according to claim 5 wherein the cams have a side of increased radius portion contiguous to the contact, said contiguity creating a torque on said shaft for holding the cams and contacts in a receiving position and an opposite torque on the shaft for holding the cams and contacts in a connecting position upon the insertion of said board into the connector cavity.

7. A connector according to claim 6 wherein said contacts in the connecting position are contiguous to the side of the portion of increased radius and creates a torque on said shaft to hold the inserted board in the connector and thereby to prevent its extraction.

References Cited by the Examiner

UNITED STATES PATENTS

| | | | |
|---|---|---|---|
| 2,654,872 | 10/53 | Saul et al. | 339—75 |
| 2,714,195 | 7/55 | Beatty | 339—45 |
| 2,765,450 | 10/56 | Richardson | 339—17 |
| 2,825,037 | 2/58 | French | 339—17 |
| 2,857,577 | 10/58 | Vanderpool | 339—17 |
| 3,022,481 | 2/62 | Stepoway | 339—75 |
| 3,130,351 | 4/64 | Giel | 339—17 X |

FOREIGN PATENTS 885,040 12/61 Great Britain.

OTHER REFERENCES

Schwamb and Merrill: "Elements of Mechanism" (1904), page 144. (Copy in Group 350.)

JOSEPH D. SEERS, *Primary Examiner.*